United States Patent
Huchzermeier et al.

(10) Patent No.: US 6,944,781 B2
(45) Date of Patent: Sep. 13, 2005

(54) METHOD OF COMMUNICATING DATA VIA A BUS AND BUS SYSTEM FOR IMPLEMENTING THE METHOD

(75) Inventors: Johannes Huchzermeier, Bruessel (BE); Michael Groenebaum, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 516 days.

(21) Appl. No.: 10/159,620

(22) Filed: May 31, 2002

(65) Prior Publication Data

US 2003/0041277 A1 Feb. 27, 2003

(30) Foreign Application Priority Data

Jun. 1, 2001 (DE) .......................................... 101 26 802

(51) Int. Cl.[7] .................................................. G06F 1/26
(52) U.S. Cl. ...................................... 713/300; 713/600
(58) Field of Search .................................. 713/300, 600

(56) References Cited

U.S. PATENT DOCUMENTS 6,658,581 B1 * 12/2003 Takahashi et al. ............ 713/401
2004/0136286 A1 * 7/2004 Nishimura et al. ........ 369/47.28

* cited by examiner

*Primary Examiner*—John R. Cottingham
(74) *Attorney, Agent, or Firm*—W. Daniel Swayze, Jr.; W. James Brady; Frederick J. Telecky, Jr.

(57) ABSTRACT

In a method of communicating data via a bus between several modules connected to the bus in accordance with the source synchronous clock principle the data is applied from the modules to a data bus as controlled by the system clock signal A source clock signal generated by each of the modules is communicated spaced in time from the data on a source clock line. The time spacing between the data applied by a module to the data bus and the source clock signal generated by this module and applied to the source clock line can be varied as a function of characteristic parameters of the modules connected to the bus with the aid of an adjustable delay member.

4 Claims, 2 Drawing Sheets

METHOD OF COMMUNICATING DATA VIA A BUS AND BUS SYSTEM FOR IMPLEMENTING THE METHOD

FIELD OF THE INVENTION

The invention relates to a method of communicating data via a bus between several modules.

BACKGROUND OF THE INVENTION

When communicating data in a bus system working with a source synchronous clock, a module, which in the sending mode outputs not only data to the data bus, also applies a source clock signal generated by it to a source clock line provided specifically for this purpose, whereby a fixed predefined time spacing is maintained between the data and the source clock signal. This time spacing is needed to ensure correct data acceptance in the receiving module in being controlled by the source clock signal. On receiving the data in the receiving module, its receiver assemblies attain a stable status before the source clock signal triggers acceptance of the data value in each case. This waiting time until the stable status is attained, following application of the data signal, is also termed the setup time in trade literature. The time spacing between the sent data and the source clock signal needs to be dimensioned so that the source clock signal in no event triggers data acceptance in the receiving module before timeout of the setup time of the receiver assemblies in each case. This time spacing to be maintained thus limits the maximum data transfer rate in the bus system. Even when modules are used in the bus system whose receiver assemblies have a shortened setup time, the system cannot work at a higher transfer rate since the time spacing between the data and the source clock signal cannot be varied.

SUMMARY OF THE INVENTION

The invention is based on the objective of configuring a method and a bus system of the aforementioned kind so that shortening the setup time by making use of sophisticated receiver components in the modules connected to the bus can be exploited for increasing the data transfer rate.

This objective is achieved in accordance with the invention in that the time spacing between the data applied by a module to the data bus and the source clock signal generated by this module and applied to the source clock line can be varied as a function of characteristic parameters of the modules connected to the bus.

In a bus system permitting operation in accordance with this method, this objective is achieved by inserting into the connection between each module and the source clock line a delay member whose delay is adjustable via a control signal which can be applied to all delay members via a control line.

By making it possible to vary the time spacing between the data and the subsequent source clock signal, the data transfer rate on the bus can be increased when the receiver components used in the modules permit this due to a shortened setup time. Thus, in taking into account the characteristic parameter "setup time" of the receiver assemblies in the modules on the bus, the data transfer rate can now be optimized by correspondingly setting the cited time spacing.

DETAILED DESCRIPTION OF THE INVENTION

Figure 1:
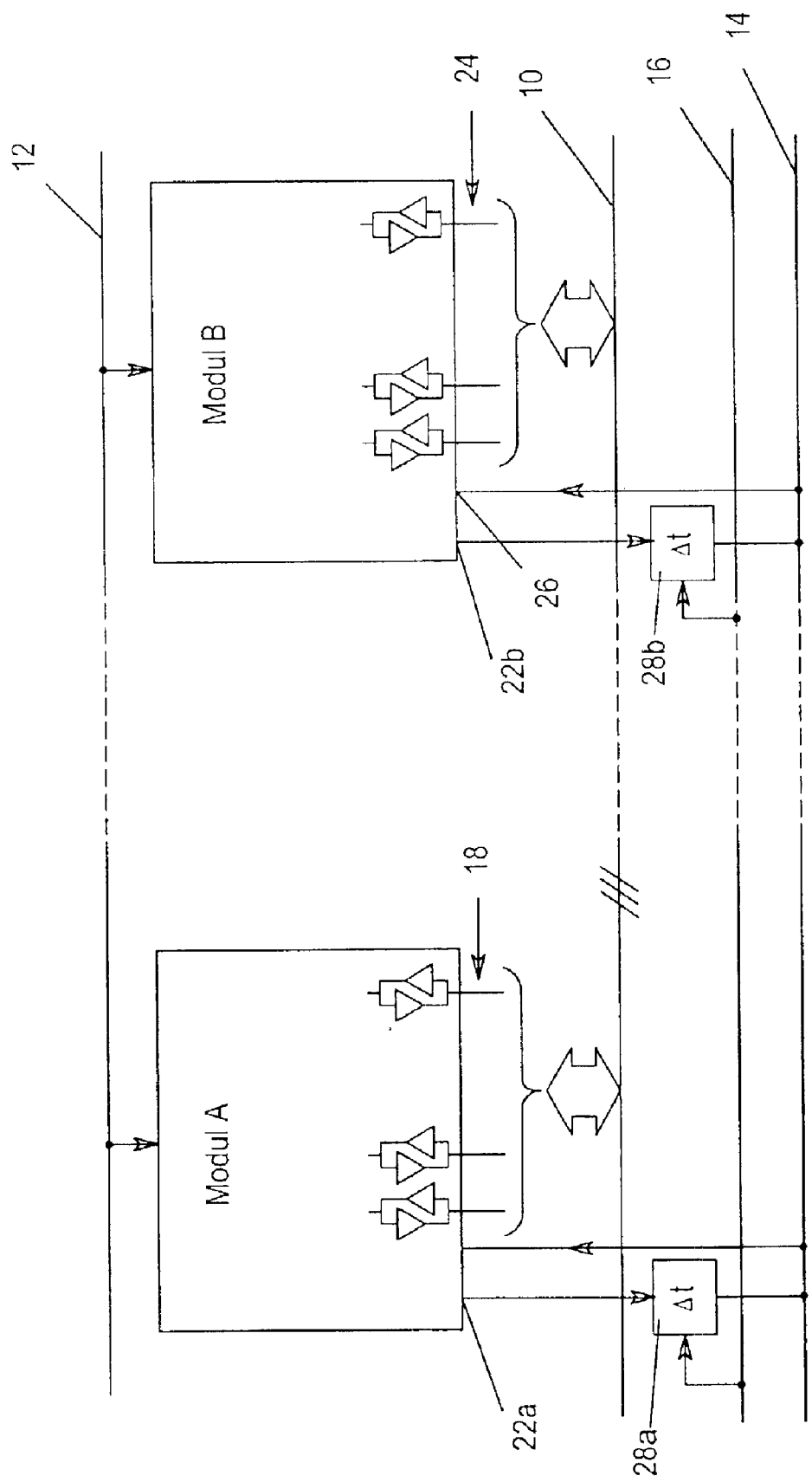
FIG. 1 is a diagrammatic illustration of a bus system via which several modules are able to communicate with each other.

Referring now to FIG. 1, there is illustrated the bus system including several sections via which the various signals can be communicated. It comprising a multicore data bus 10 via which data is communicated between the modules A and B as well as a system clock line 12 via which all modules in the bus are supplied a system clock signal. Via a source clock line 14, a source clock signal is communicated and a control line 16 serves for communicating a clock signal as described further on.

Assuming in the following description that module A is to send data to module B, the data to be output in module A is generated in circuit assemblies (not shown) and applied to the data bus 10 via bi-directional input/output terminals 18. Except for a fixed phase shift, the data is output in synchronism with the system clock signal which is supplied to module A via the system clock line 12.

Figure 2:
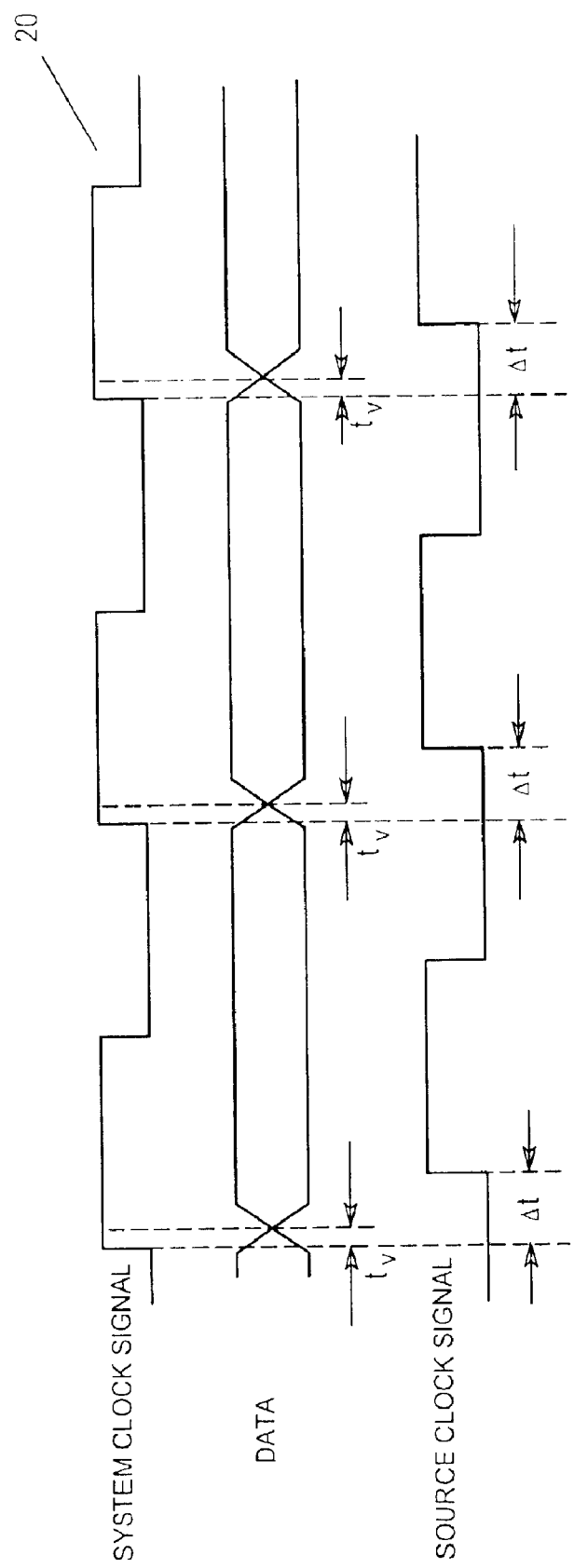
FIG. 2 is a time plot assisting explanation of a data communication procedure in the bus system as shown in FIG. 1.

Referring now to FIG. 2, there is illustrated the system clock signal 20 which takes the form of a periodic square-wave signal. The data output occurs at the input/output terminals 18 with a delay $t_v$ relative to the source synchronous clock signal. As evident from the second line in FIG. 2, the data output is signified by the value of the signal at an input/output terminal 18, changing either from "0" to "1" or from "1" to "0".

Since the data is to be communicated in accordance with the principle of source synchronous clocking, a source clock signal is output at an output 22a by the module A after output of the data to the input/output terminals 18, the source clock signal being applied to the source clock line 14 with a delay t. It is evident that the source clock signal indicated in the third line of FIG. 2 is delayed by t relative to the system clock signal in the first line.

The data signals gain access via the data bus 10 to the input/output terminals 24 of the module B by each being applied to a module connected to the corresponding input/output terminals 24 as is usual in such bus systems. The actual acceptance of the data signals in the module B then occurs when the module B receives, on timeout of the delay t, the source clock signal via the source clock line 14 and the terminal 26. This means that, in receiving the data signals, the corresponding modules in module B are prepared for accepting the data so that on receiving the source clock signal they change in status corresponding to the date signal value "0" or "1" in each case. The delay t of the source clock signal relative to the data signals on the data bus 10 is necessary to take into account the setup time of the modules accepting the data in the module B as required by these modules until they are ready to accept the data. This setup time is the salient factor in establishing the highest possible data transfer rate since the source clock signal must not receive from module B before timeout of the setup time of the components in module B accepting the data. Should the source clock signal arrive prior to timeout of the setup time on module B, there is no longer any assurance of the data being correctly accepted and correspondingly further processed.

It will be appreciated from the above comments that, depending on the setup time of the components used in the modules active as receivers for data acceptance, the system can work with a higher or lower transfer rate. To adapt the system to this setup time the delay t, i.e. the time spacing between applying the data to the data bus 10 and applying the source clock signal to the source clock line 14, can be varied. For this purpose the delay t of the delay members 28a, 28b each inserted between the corresponding output 22a, 22b of a module and the source clock line 14, can be set with the aid of a control signal on the control line 16. When use is made of modules including data acceptance components having a short setup time, the time spacing between data output and applying the source clock signal to the source clock line 14 can be shortened so that a correspondingly higher data transfer rate is achievable, whereas when "slower" data acceptance components are used in the modules, this delay time t can be lengthened to ensure satisfactory data acceptance in this case, too.

Varying the delay t of the delay members 28a, 28b can be done by means of a digital control signal with the aid of which, for example, two different delay times can be achieved, depending on whether the clock signal has the value "0" or 25 the value "1". However, the delay members 28a, 28b could also be configured so that their delay time can be varied with the aid of an analog control signal so that depending on the size of the clock signal any desired value of the delay t can be set within a predefined range.

Another advantage of the possibility of being able to set the time spacing between the data on the data bus 10 and the source clock signal of the source clock line 14 is that not only the different setup time of the data acceptance components in the modules can be taken into account but also other factors influencing the data transfer rate on the bus, for example, the aforementioned delay tv between the system clock signal and the data output as well as other such transit delays throughout the complete system.

In the example as described it was assumed that module A and module B send and receive the data respectively. It will readily be appreciated, however, that in principle any module connected to the system may function both for sending and receiving data.

What is claimed is:

1. A method of communicating data via a bus connected to a module to form a system, comprising the steps of:

generating a source clock signal by the module;

applying data to a data bus as controlled by a system clock signal from the module;

applying said source clock signal to a source clock line spaced in time from the data; and varying the time spacing between the data from the module and the source clock signal generated by the module and applied to the said clock line as a function of a data transfer rate of the bus.

2. A bus system for communicating data between modules by a bus;

a module for applying said data to said bus in accordance with a system clock signal;

said module generating a source clock signal and applying said system clock signal on a source clock line; and a delay line positioned between said module and said source clock line having a delay time adjustable by a control line.

3. The bus system as set forth in claim 2, wherein said control signal is a digital signal by which said delay time can be set to one of several discrete values.

4. The bus system as set forth in claim 2, wherein said control signal is an analog signal by which said delay time can be set to a value with a predefined range.

* * * * *